(12) United States Patent
Trouilloud

(10) Patent No.: US 7,622,784 B2
(45) Date of Patent: Nov. 24, 2009

(54) MRAM DEVICE WITH IMPROVED STACK STRUCTURE AND OFFSET FIELD FOR LOW-POWER TOGGLE MODE WRITING

(75) Inventor: Philip L. Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 10/905,551

(22) Filed: Jan. 10, 2005

(65) Prior Publication Data

US 2006/0152969 A1 Jul. 13, 2006

(51) Int. Cl.
*G11C 11/02* (2006.01)
(52) U.S. Cl. .............................. 257/421; 257/E27.006; 365/158
(58) Field of Classification Search ................. 365/158; 257/421, E21.665, 422, 427, E27.006
See application file for complete search history.

(56) References Cited

U.S. PATENT DOCUMENTS

| 6,545,906 | B1 | 4/2003 | Savtchenko et al. | 365/158 |
| 6,625,059 | B1* | 9/2003 | Sharma et al. | 365/173 |
| 6,633,498 | B1 | 10/2003 | Engel et al. | 365/158 |
| 6,654,278 | B1* | 11/2003 | Engel et al. | 365/158 |
| 7,033,881 | B2 | 4/2006 | Gaidis et al. | 257/295 |
| 2005/0047198 | A1* | 3/2005 | Engel et al. | 365/158 |
| 2005/0099738 | A1* | 5/2005 | Xue et al. | 360/324.1 |
| 2005/0253128 | A1 | 11/2005 | Worledge | 257/2 |
| 2005/0280040 | A1* | 12/2005 | Kasko et al. | 257/213 |

OTHER PUBLICATIONS

Conraux et al., Effects of swift heavy ion bombardment on magnetic tunnel junction functional properties, J. Appl. Phys. 93, 7301 (2003).*
M. Durlam et al.; "A 0.18um 4Mb Toggling MRAM;" IEEE 2003.
W. Reohr et al.; "Memories of Tomorrow;" IEE Circuits & Devices Magazine, Sep. 2002, pp. 17-27.
D. C. Worledge; "Spin flop switching for magnetic random access memory;" Applied Physics Letters, vol. 84, No. 22, May 31, 2004; pp. 4559-4561.

* cited by examiner

*Primary Examiner*—Anh Phung
*Assistant Examiner*—Michael Lulis
(74) *Attorney, Agent, or Firm*—Cantor Colburn LLP; Ido Tuchman

(57) ABSTRACT

A magnetic random access memory (MRAM) device includes a reference magnetic region having a resultant magnetic moment vector generally maintained in a desired orientation without the use of exchange coupling thereto. A storage magnetic region has an anisotropy easy axis and a resultant magnetic moment vector oriented in a position parallel or antiparallel to that of the reference magnetic region. A tunnel barrier is disposed between the reference magnetic region and the storage magnetic region, with the reference magnetic region, storage magnetic region and tunnel barrier defining a storage cell configured for a toggle mode write operation. The storage cell has an offset field applied thereto so as to generally maintain the resultant magnetic moment vector of the reference magnetic region in the desired orientation.

14 Claims, 7 Drawing Sheets

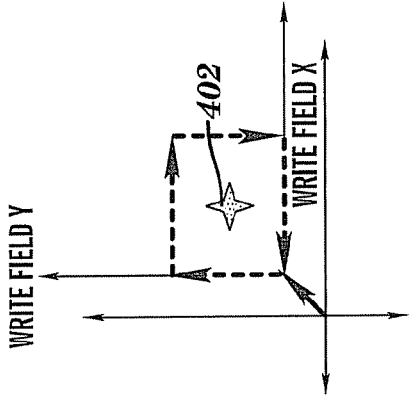
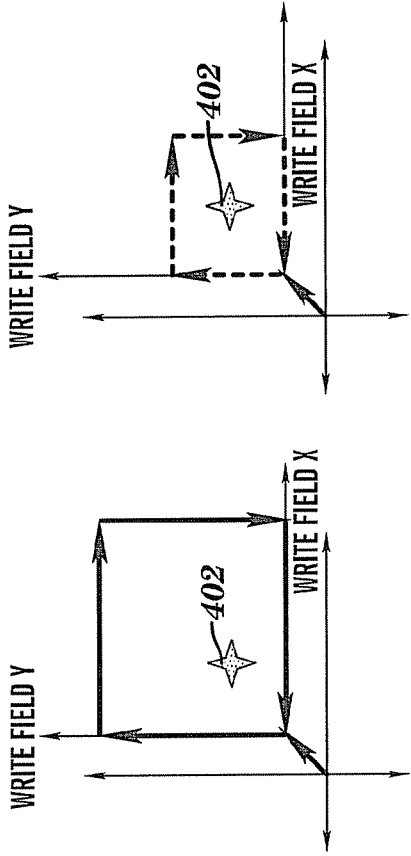
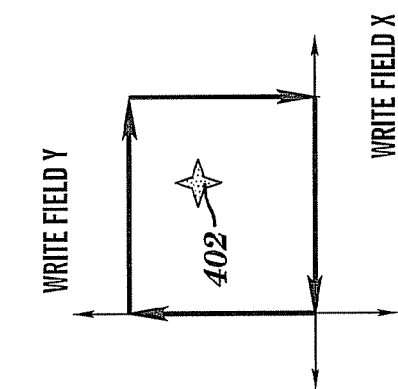
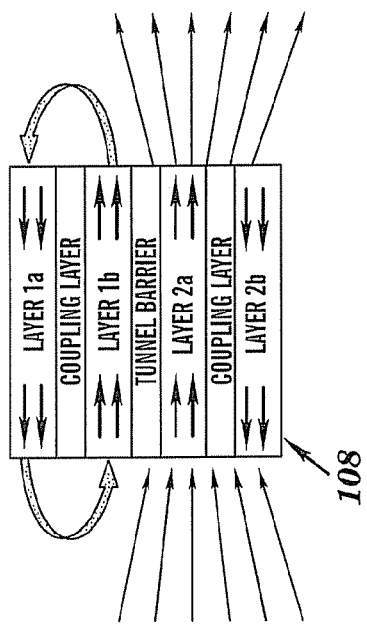

MRAM DEVICE WITH IMPROVED STACK STRUCTURE AND OFFSET FIELD FOR LOW-POWER TOGGLE MODE WRITING

BACKGROUND OF THE INVENTION

The present invention relates generally to magnetic random access memory devices, and, more particularly, to a method and structure for implementing an improved stack structure for a toggling MRAM device having an offset field for reduced power consumption.

Magnetic (or magneto-resistive) random access memory (MRAM) is a non-volatile random access memory technology that could replace the dynamic random access memory (DRAM) as the standard memory for computing devices. The use of MRAM as a non-volatile RAM would allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by an insulating nonmagnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is usually maintained in a preassigned direction, while the magnetic moment of the magnetic layer on the other side of the tunnel barrier (also referred to as a "free" layer) may be switched during operation between the same direction and the opposite direction with respect to the fixed magnetization direction of the reference layer. The orientations of the magnetic moment of the free layer adjacent to the tunnel junction are also known as "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is typically "low" when the magnetization is parallel, and "high" when the magnetization is antiparallel. Accordingly, a detection of changes in resistance allows a MRAM device to provide information stored in the magnetic memory element (i.e., a read operation). There are different methods for writing a MRAM cell; for example, a Stoner-Wohlfarth astroid MRAM cell is written to through the application of fields to exceed a critical curve or stability threshold, in order to magnetically align the free layer in a parallel or antiparallel state. The free layer is fabricated to have a preferred axis for the direction of magnetization called the "easy axis" (EA), and is typically set by a combination of intrinsic anisotropy, strain induced anisotropy, and shape anisotropy of the MTJ.

When a sufficiently large current is passed through both a wordline and a bitline of the MRAM, the combined fields of these currents at the intersection of the write and bit lines will switch the magnetization of the free layer of the particular MTJ located at the intersection of the energized write and bit lines. The current levels are selected such that the combined fields exceed the switching threshold of the free layer. For a Stoner-Wohlfarth astroid MRAM structure, the EA is aligned with the orientation of either the bitline or the wordline.

As the lateral dimension of an MRAM device decreases, several problems can occur. First, the switching field increases for a given shape and film thickness, thus requiring a larger magnetic field for switching. Second, by further reducing the film thickness to maintain acceptable switching fields, the total switching volume is reduced such that the energy barrier for reversal also decreases, wherein the energy barrier refers to the amount of energy needed to switch the magnetic moment vector from one state to the other. The energy barrier determines the data retention and error rate of the MRAM device, and thus unintended reversals can occur due to thermal fluctuations if the barrier is too small. Furthermore, with a small energy barrier it becomes extremely difficult to selectively switch a single MRAM device in an array without inadvertently switching other MRAM devices. Thirdly, because of the increased impact of the shape anisotropy, the switching field becomes more sensitive to shape variations as the MRAM devices decrease in size.

In this regard, there has been introduced an MRAM device in which the free layer of ferromagnetic material includes multiple (e.g., two) ferromagnetic layers separated by a nonmagnetic coupling layer. Due to magnetostatic coupling, the magnetic moments of the two ferromagnetic layers are antiparallel to one another. This configuration allows for a different method of writing that improves selectivity. An exemplary configuration aligns the axis of intrinsic magnetic anisotropy at a 45° angle with respect to the orientation of the word and bitlines. The device can be patterned to include shape anisotropy, and in an exemplary configuration is also aligned at a 45° angle with respect to the orientation of the word and bitlines.

More specifically, the writing method relies on a toggle phenomenon that gently rotates the magnetic moment vectors of the two ferromagnetic layers so they switch directions. In the X-Y field plane, the fields follow a closed trajectory or "toggle-box" that encloses a critical point called the spin-flop point. The magnitudes of the required fields are dependent on the location of this spin-flop point. Current waveforms applied to the wordline and bitline in a timed sequence induce a magnetic field trajectory which reliably toggles the state of the multifilm free layer, such that the magnetization of the film closest to the tunnel barrier will switch direction (i.e., "toggle"), and at remanence the partner film in the free layer maintains a near antiparallel magnetization to the aforementioned film. Reduction in power consumption may be attainable by moving the spin flop point closer to the origin of the wordline and bitline field graph so as to decrease the size of the "toggle box" around the spin flop point, and thus decreasing the magnitude of the applied write current in the bitline and wordline.

Another issue related to the manufacture of MRAM devices is the manner in which the reference layer is maintained in its set orientation. This may be accomplished by using a high coercivity reference stack or, alternatively, by using an antiferromagnetic pinning layer that couples to the reference layer. One disadvantage of using a high coercivity reference layer is that the stack can lose its orientation under the influence of repeated write cycles. On the other hand, the more common approach is to utilize an antiferromagnet coupled tightly to a ferromagnet to form a pinned reference stack. Typical antiferromagnets for the pinned layer stack include materials such as IrMn or PtMn, and their incorporation adjacent to the sensitive magnetics of the MRAM device presents certain manufacturing challenges. The galvanic properties of the noble metal-like (Ir or Pt-containing) material, and the out-diffusion of certain elements (e.g., manganese) in the materials can result in device degradation. At certain processing steps in the patterning of the devices, large areas of the noble metal-like antiferromagnet may be exposed, and can drive harmful corrosive reactions with the sensitive magnetic films near the tunnel barrier.

In addition, during thermal processing of an MRAM device, device degradation due to diffusion of, for example, manganese through the reference layer and into the tunnel barrier and nearby magnetic films can degrade device performance and thus will limit the temperature to which the devices can be exposed. This also limits the choice of materials that can be utilized near the device, as processing temperatures (e.g., for standard PECVD dielectrics or final device packaging) can be high enough to destroy the device through outdiffusion of pinned-layer elements. Thus, additional manufacturing benefits could be obtained by inhibiting the diffusion of antiferromagnetic material from a pinned layer into a tunnel barrier and nearby magnetic films and by processing materials which drive strong galvanic reactions at times when the sensitive tunnel barrier and nearby magnetic films are not present or exposed.

Accordingly, it would be desirable to be able to manufacture an MRAM device such that the reference layer is properly aligned during "read" operations, wherein the "spin-flop" point is desirably shifted towards the origin of the wordline and bitline field graph, and wherein the device inhibits diffusion of antiferromagnetic material from one or more pinned layers with respect to the tunnel barrier(s) and nearby magnetic films. Furthermore, it is desirable to be able implement the formation of such a device in a practical manner.

SUMMARY

The foregoing discussed drawbacks and deficiencies of the prior art are overcome or alleviated by a magnetic random access memory (MRAM) device. In an exemplary embodiment, the device includes a reference magnetic region having a resultant magnetic moment vector generally maintained in a desired orientation without the use of exchange coupling thereto. A storage magnetic region has an anisotropy easy axis and a resultant magnetic moment vector oriented in a position parallel or antiparallel to that of the reference magnetic region. A tunnel barrier is disposed between the reference magnetic region and the storage magnetic region, with the reference magnetic region, the storage magnetic region and the tunnel barrier defining a storage cell configured for a write operation thereto by a toggle mode. The storage cell has an offset field applied thereto so as to generally maintain the resultant magnetic moment vector of the reference magnetic region in the desired orientation.

In another embodiment, a magnetic random access memory (MRAM) device includes a reference magnetic region having a resultant magnetic moment vector aligned in a desired orientation by a bias element physically separated from the reference magnetic region by a spacer layer. A storage magnetic region has an anisotropy easy axis and a resultant magnetic moment vector oriented in a position parallel or antiparallel to that of the reference magnetic region. A tunnel barrier is disposed between the reference magnetic region and the storage magnetic region, with the reference magnetic region, the storage magnetic region and the tunnel barrier defining a storage cell configured for a write operation thereto by a toggle mode. The bias element and spacer layer are further configured within a vertical stack of the storage cell, and the bias element is configured to generate an offset field applied to the storage cell so as to generally maintain the resultant magnetic moment vector of the reference magnetic region in the desired orientation.

BRIEF DESCRIPTION OF THE DRAWINGS

Referring to the exemplary drawings wherein like elements are numbered alike in the several Figures:

FIGS. 4(a) through 4(c) are graphs illustrating the toggle mode of MRAM switching with respect to the applied write field in X and Y directions and a spin-flop point;

FIG. 5 schematically illustrates the coupling of a reference layer stack to an external field;

DETAILED DESCRIPTION

Figure 1:
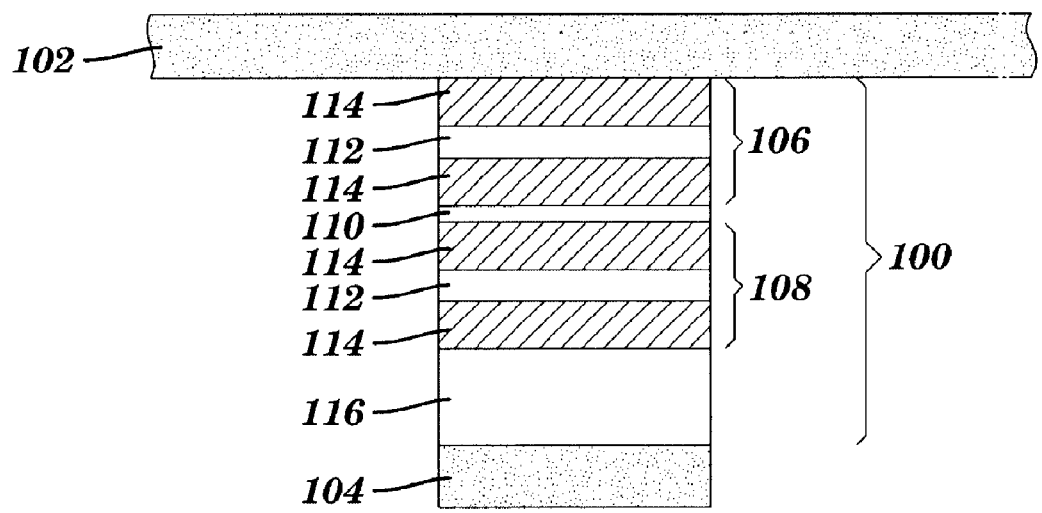
FIG. 1 sectional view of a single storage element of an existing MRAM structure configured for toggle-mode switching at reduced power.

Referring initially to FIG. 1, there is shown a sectional view of a single storage element 100 of an existing MRAM structure, such as that described in U.S. Pat. No. 6,633,498 to Engel, et al., the contents of which are incorporated herein by reference in their entirety. The storage element 100 is disposed between a wordline 102 and a bitline 104. In the example illustrated, the wordline 102 is shown positioned on top of the storage element 100 while the bitline 104 is positioned on the bottom of the storage element 100, and is oriented at a 90° angle with respect to the wordline 102. It will be understood, however, that the relative positions of the wordline 102 and bitline 104 may be reversed (i.e., the wordline 102 on the bottom of the storage element 100 and the bitline 104 on the top of the storage element 100). It will also be appreciated that a practical MRAM array structure will include several storage elements, each located at corresponding intersections of an array of wordlines and bitlines.

More particularly, the storage element 100 in FIG. 1 includes a storage (free layer) stack/region 106, a (pinned) reference stack/region 108, and a tunneling barrier 110 sandwiched therebetween. The tunneling barrier 110 may include, for example, an electrically insulating material, such as aluminum oxide or the like to form a tunneling junction. Furthermore, in the example depicted, the storage stack (or free layer) 106 is characterized by (at least) a tri-layer structure having a non-magnetic spacer layer 112 sandwiched between a pair of ferromagnetic layers 114. Generally, the ferromagnetic layers 114 may include elements such as Ni, Fe, Co, or combinations thereof, while the non-magnetic spacer layers 112 may include elements such as Ru, Os, Ti, Ta, Cr, Rh, Pt, Cu, Pd, or combinations thereof. The reference stack 108 may also be characterized by a tri-layer structure having a non-magnetic spacer layer 112 sandwiched between a pair of ferromagnetic layers 114, like the storage stack 106, but could also be embodied by a single ferromagnetic layer.

In order to preserve a fixed net magnetic moment vector of the reference stack 108 (so as to enable a read operation of the element 100), an antiferromagnetic layer 116 is disposed directly beneath the reference stack 108, thus pinning the reference stack 108 due to exchange coupling therebetween. As a result, the magnetic moment vector of the reference stack 108 is not free to rotate in the presence of an applied magnetic field, such as would be the case for the magnetic moment vector of the storage stack 106 during a write operation of the element 100.

Figure 2:
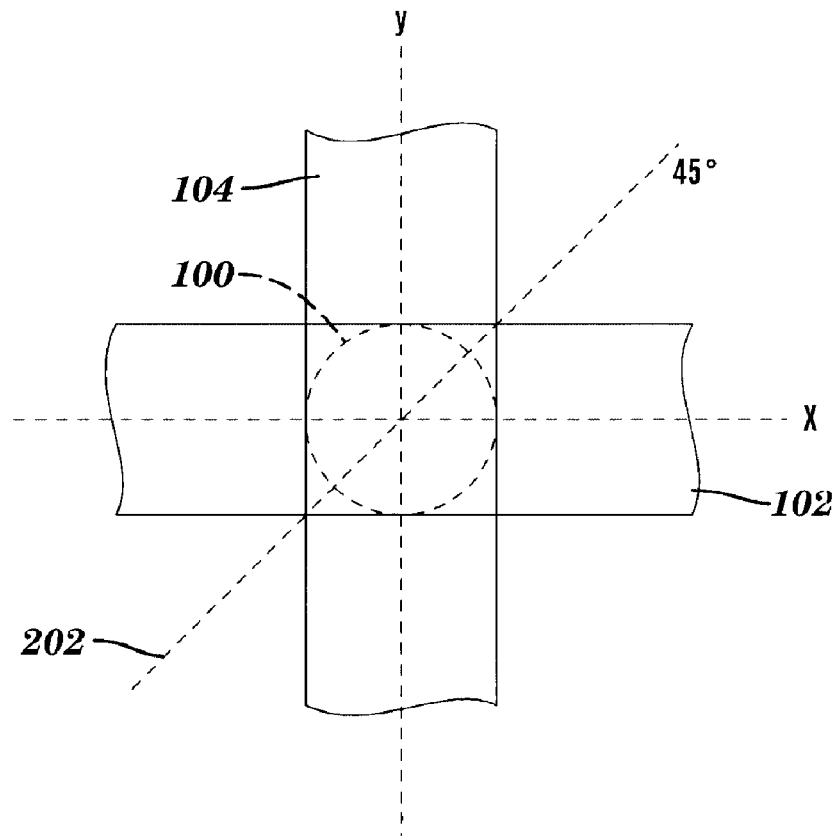
FIG. 2 is a top view of the MRAM structure depicted in FIG. 1.

FIG. 2 is a top view of the MRAM structure depicted in FIG. 1. Although the illustrated embodiment features a generally circular shaped storage element 100, it should be understood that the storage element 100 may take the form of other shapes, such as square, elliptical, rectangular, or diamond, for example. Also illustrated in FIG. 2 is the easy anisotropy (EA) axis 202 of the storage stack 106 of the storage element 100. Although the EA axis 202 is depicted at about a 45° angle with respect to the orthogonal x and y-axes defined by the wordline 102 and bitline 104, this need not necessarily be the case.

Figure 3:
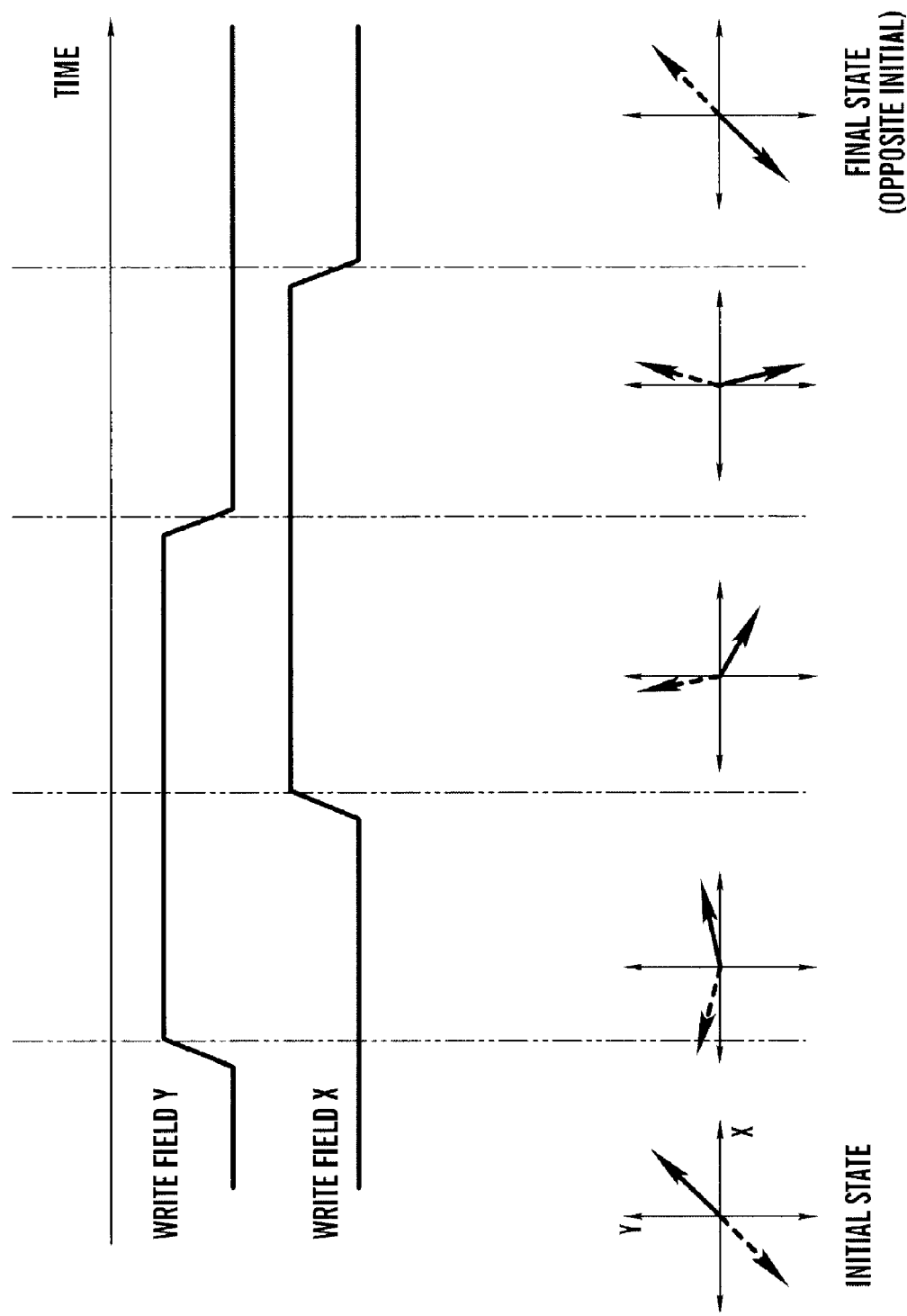
FIG. 3 illustrates a timing diagram and corresponding direction of magnetization for an exemplary operation of a write cycle applied to a toggle-mode MRAM device, wherein the dotted and solid vectors in the X-Y plot represent the magnetization direction of the two different magnetic films in a toggle-mode free layer.

The configuration of the storage and reference stacks shown in FIGS. 1 and 2 is particularly suited for what is known as "toggle-mode" switching, developed by Savtchenko, et al. and discussed in further detail in U.S. Pat. No. 6,545,906, the contents of which are incorporated herein in their entirety. In a toggle-mode device, the two coupled free magnetic layers 114 of the storage stack 106 are switched through a carefully controlled (timed) application of write fields in two axes. The timing of the write fields allows a scissoring of the magnetization in the antiparallel layers comprising the storage stack to take place to switch the devices. FIG. 3 illustrates a timing diagram and corresponding direction of magnetization for an exemplary operation of a write cycle applied to a toggle-mode MRAM device, such as element 100. In the X-Y graphs at the bottom portion of FIG. 3, the dashed vector indicates the net magnetization of the ferromagnetic bottom free layer 114 in the storage stack 106, while the solid vector indicates the net magnetization of the ferromagnetic top free layer 114 of the storage stack 106.

The toggle mode of switching shown in FIG. 3 may also be represented by the graph of FIG. 4(a), which depicts a path drawn on an X-Y write field graph representing the sequential application of magnetic fields used to switch a toggle-mode device from one state to another. Beginning at the origin, a field is applied in the Y-direction, followed by a field in the X direction. The field in the Y-direction is then removed while the X-direction field is maintained. Finally, the X-direction field is removed, thus completing the loop back to the origin as shown. It will be appreciated that this loop must be traversed such that the "spin-flop" point 402 of the device is enclosed inside the loop. The spin-flop point is located at a position in the X-Y plane determined by the characteristics of the free layers (e.g., film magnetization, intrinsic magnetic anisotropy, coupling strength, etc.) and the embedding environment (external magnetic fields). Additional information regarding the determination of spin-flop point location may be found in the publication of D. Worledge, "Spin Flop Switching for Magnetic Random Access Memory," *Applied Physics Letters*, 84, pp. 4559-4561, 2004, the contents of which are incorporated herein by reference in their entirety.

Although the toggle mode of MRAM writing has better scaling characteristics than conventional-write devices, it stands to reason that if the MRAM device is fabricated in a manner such that the origin of the bit and word fields is shifted closer to the spin-flop point 402 as shown in FIG. 4(b), then reductions in applied power may be attained as shown by the tighter loop of FIG. 4(c). Conversely, in the plane of bit and word fields, the location of the spin-flop point is moved closer to the origin. In this regard, the Engel device of FIG. 1 further utilizes the application of a background magnetic field at 45 degrees with respect to the X and Y write fields, such that the spin flop point is in fact moved towards the origin of the bit and word fields.

As stated previously, however, the location of the antiferromagnetic layer 116 in contact with the reference stack 108 (and in relatively close proximity to the tunnel barrier 110) introduces certain manufacturing issues, such as the relative thickness of the antiferromagnetic layer 116, which in turn can cause undesirable roughness and texturing in the subsequent layers of the structure. In addition, diffusion of the antiferromagnetic layer materials is also a concern with respect to potential degradation of the tunnel barrier 110.

Well-balanced free layers of a toggle mode MRAM device couple tightly to one another so that their state is relatively immune to external fields. As such, a shift in the spin-flop point is the only significant effect on the coupled free layers, for moderately sized fields. Advantageously, it has been discovered that it is possible to physically separate a pinned layer (stack) from the reference layer (stack) in order to realize added benefits in terms of manufacturability and thermal stability. In other words, by moving the antiferromagnetic pinning layer away from the sensitive tunnel barrier (or eliminating it altogether), the diffusion of manganese antiferromagnet material used in the pinning layer may be inhibited, thus allowing the tunnel barrier to survive higher temperature processing. Similar manufacturability benefits may be achieved by removing the noble metal-like antiferromagnet to a location where its galvanic properties do not enhance corrosion of the sensitive device films.

By way of illustration, FIG. 5 schematically illustrates the coupling of the reference layer 108 to an external field 502. Because the total moment of the reference layer stack 108 (also labeled as coupled layers "2a" and "2b" in FIG. 3) couples to external fields, it will align parallel thereto. It should also be noted that only positive bit and word fields are applied during the write operation of a toggle mode device. Thus, for a strong-enough external field, the reference layer stack 108 will not be switched, but will instead return to this fixed position after any write operations. Even if the reference layer magnetization direction fluctuates during write operations (i.e., when other fields are applied to the device), it will still be stabilized in the position aligned with field 502 when the read operation takes place. In contrast, the storage (free) layer stack 106 (also labeled as layers "1a" and "1b" in FIG. 3) does not strongly align parallel to the external field 502 since the layers primarily couple internally therebetween.

Therefore, in accordance with an embodiment of the present invention, an MRAM storage element is disclosed wherein suitable magnitudes of external field may be chosen such that the resulting magnetic moment of the reference layer stack is properly aligned during read operations, and such that the spin-flop point is also advantageously shifted toward the origin as represented in the graphs of FIG. 4. Moreover, the reduced power operation of the MRAM devices may be achieved by using offset fields, simultaneously with the advantage of increased manufacturability of devices having an antiferromagnetic layer disposed at a distance with respect to the tunnel barrier and reference stack, or by having the antiferromagnetic layer eliminated entirely. It should be noted that because the effect of offset field on the free stack will be reduced by the stray fields from the reference stack, the magnitude of the offset field acting on the reference stack may thus be made larger than otherwise provided for shifting the spin-flop point.

Figure 6:
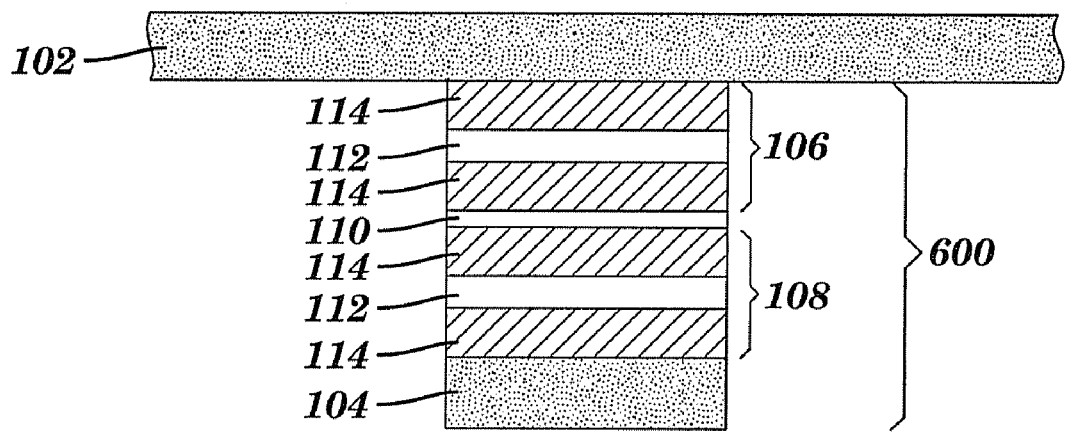
FIG. 6 is a cross sectional view of a simplified stack MRAM structure, configured for toggle-mode switching at reduced power, in accordance with an embodiment of the invention.

Referring now to FIG. 6, there is shown a cross sectional view of an MRAM storage element 600 formed in accordance with an embodiment of the invention. For ease of description, similar reference numerals are used to designate like elements with respect to FIG. 1. As will be noted, the element(s) of reference stack 108 are not "pinned" or fixed in a preferred orientation, in the sense that there is no antiferromagnetic layer used in the stack to pin the reference stack 108 in a fixed orientation. Thus, in the embodiment of FIG. 6, the reference stack 108 may be formed directly on the cell's lower electrode (e.g., bitline 104). Again, while the reference region 108 is depicted in the exemplary embodiment as a pair of antiferromagnetic layers surrounding a coupling layer (i.e., a stack), the reference region 108 could also be embodied by a single ferromagnetic layer.

Although the reference stack 108 is not pinned through the use of an adjacent coupling antiferromagnetic layer (nor need the reference stack 108 be made from high coercivity materials that can lose its orientation over repeated write cycles), the net magnetic moment of reference stack 108 is still generally maintained in its desired orientation due to the manner in which the storage stack 106 is written (i.e., by a toggle-mode operation), combined with the use of a constant bias or offset field generated for reduced power writing of the storage stack 106. In one embodiment, the coercivity of the reference stack is less than about 100 Oersteds (Oe).

A constant bias or offset field may be implemented by several methodologies including, for example, the use of an external device with respect to the memory array, such as a coil or permanent magnet (not shown). Still another method for creating an offset field is to fonri magnetic materials between individual storage elements within an MRAM array (i.e., the bias field elements are within the an-ay region but are not a part of the same vertical stack as the memory storage stack elements), as is described in further detail hereinafter. As also described in further detail below, an offset field source may be incorporated in the vertical memory stack itself. In addition, more specific embodiments for forming and setting of layers that generate external offset fields may also be found in U.S. patent application Ser. No. 10/905,541, filed concurrently herewith, and the contents of which are incorporated herein in their entirety.

Figure 7:
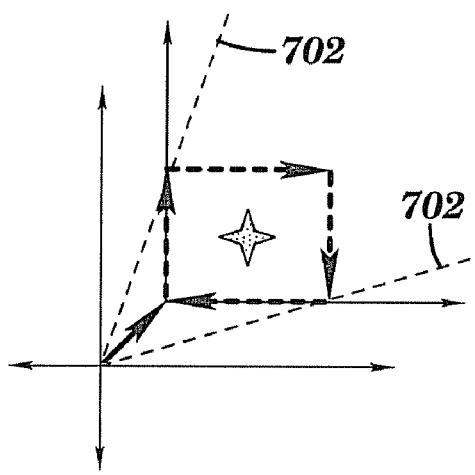
FIG. 7 is a graph illustrating the relationship of the applied offset field and write fields to a toggle mode write cell, particularly demonstrating the capability of eliminating an antiferromagnetic pinning layer with respect to the reference stack.

As depicted in the graph of FIG. 7 (taken from FIG. 4(c)), the presence of the offset field along the easy axis of the storage element can reduce the amount of current needed to switch the state of the net magnetization vector of the storage stack. Moreover, because of the nature of toggle mode switching, the applied write fields are within +/−45 degrees of the set direction in the reference stack, and would therefore not tend to switch it. This is illustrated by a cone 702 that encompasses the range of fields applied to the reference stack during a toggle mode write of the storage stack. Accordingly, this effect allows for a simpler configuration of MRAM stack materials (e.g., no pinning AF layer with respect to the reference layer) and/or a wider selection of texture-enhancing seed layers.

Figure 8:
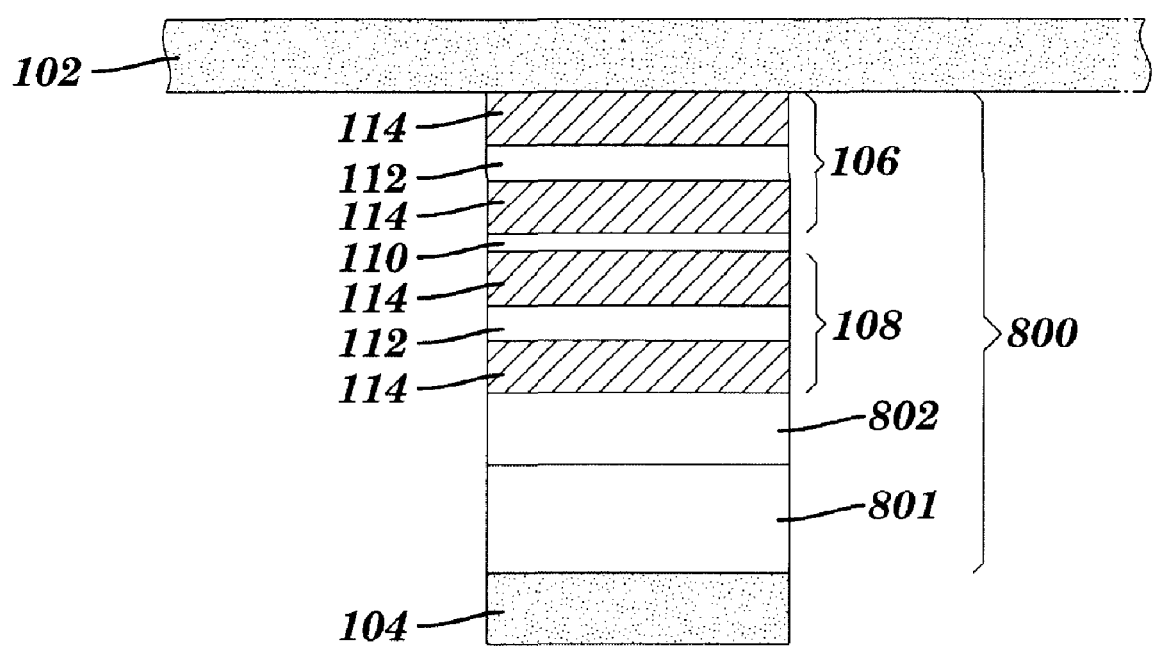
FIG. 8 is a cross sectional view of an MRAM structure configured for toggle-mode switching at reduced power, in which an antiferromagnetic layer is remotely located with respect to the reference stack and tunnel barrier, in accordance with an alternative embodiment of the invention.

FIG. 8 is a cross sectional view of an MRAM structure having a storage element 800 configured for toggle-mode switching at reduced power, in accordance with an alternative embodiment of the invention. In this embodiment, a bias (offset) field source is incorporated into the vertical cell stack using a pinned ferromagnetic material, however the associated pinning antiferromagnetic layer is remotely located with respect to the reference stack and tunnel barrier. More specifically, an antiferromagnetically pinned ferromagnetic offset source stack 801 (i.e., a bias element) has a pinned ferromagnetic layer therein, and a pinning antiferromagnetic layer therein is physically separated from the reference stack 108 by a conductive spacing layer 802 (or plurality of spacing layers). In order to provide a diffusion barrier and establish a desired texture for the subsequently formed magnetic stack materials, the resulting thickness of spacing layer 802 is preferably on the order of about 50 angstroms or more. Thus configured, the offset source stack 801 may be thermally set, patterned, backfilled and planarized before resuming the deposition of the magnetic stack materials. This in turn allows for a much better selection of diffusion barrier materials in order to isolate the AF material in the offset source stack 801 from the tunneling barrier 110.

It is further possible to incorporate the offset source stack 801 into the trenches used in the formation of the adjacent cell electrode (e.g., bitline 104). This is described in further detail in U.S. Pat. No. 7,033,881, and assigned to the assignee of the present application, the contents of which are incorporated herein in their entirety. Generally, a ferromagnet is deposited at the base of a trench using directional deposition methods known in the art. An antiferromagnetic pinning layer is deposited primarily at the base of the trench using similar methods, either just before or just after the ferromagnet. An anneal in a magnetic field is used to set the proper coupling and magnetization direction, and negates the effect of any antiferromagnet which may reside on the sidewalls. Alternatively, high $H_c$ materials can be directionally deposited to reside in the bottom of the trench, and deposition in a field, anneal/magnetic field combination, or a field alone can be used to set the magnetization direction.

Figure 9:
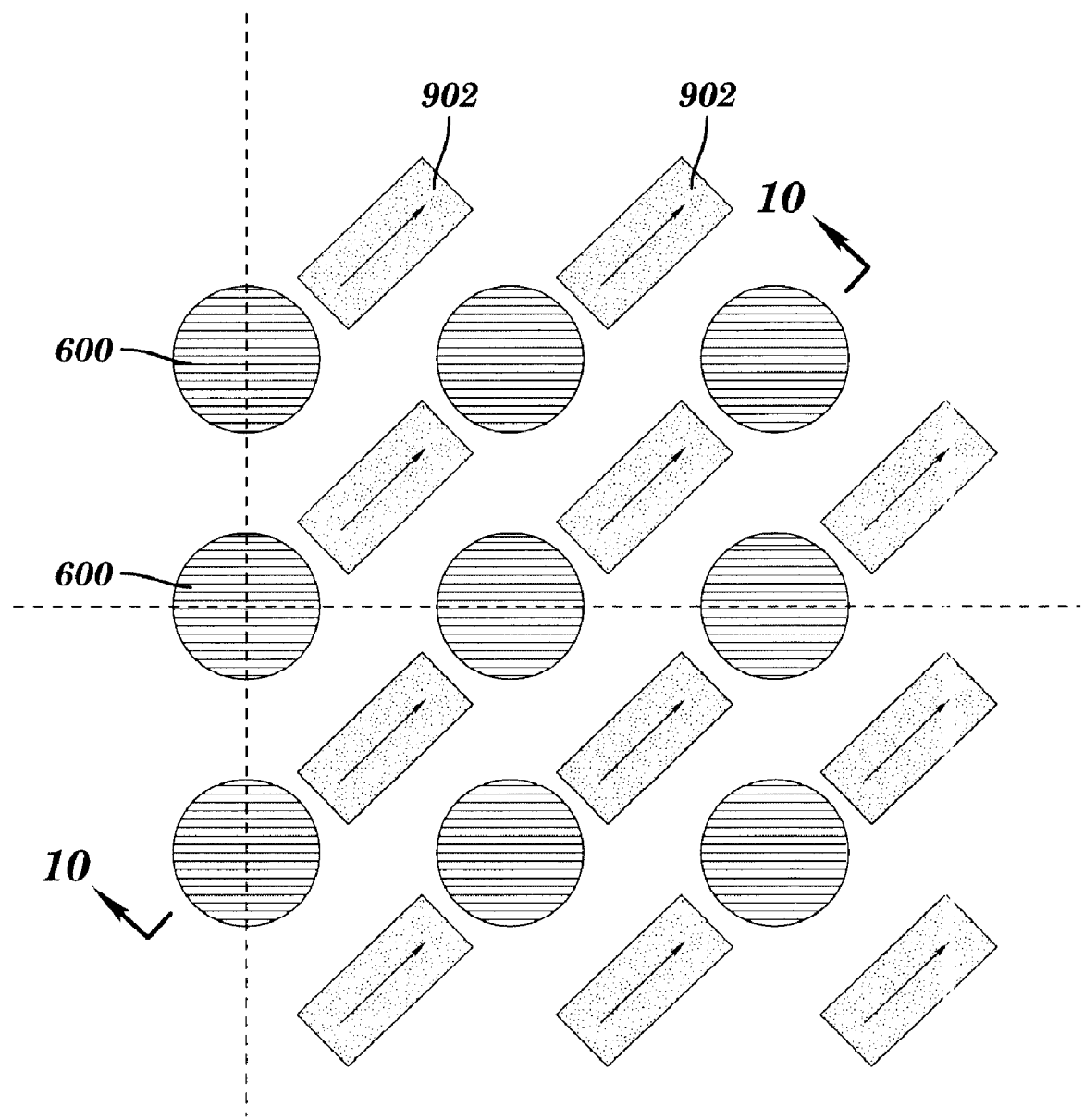
FIG. 9 is a top view of a plurality of MRAM storage elements, wherein a offset field source is disposed between the individual storage elements.
Figure 10:
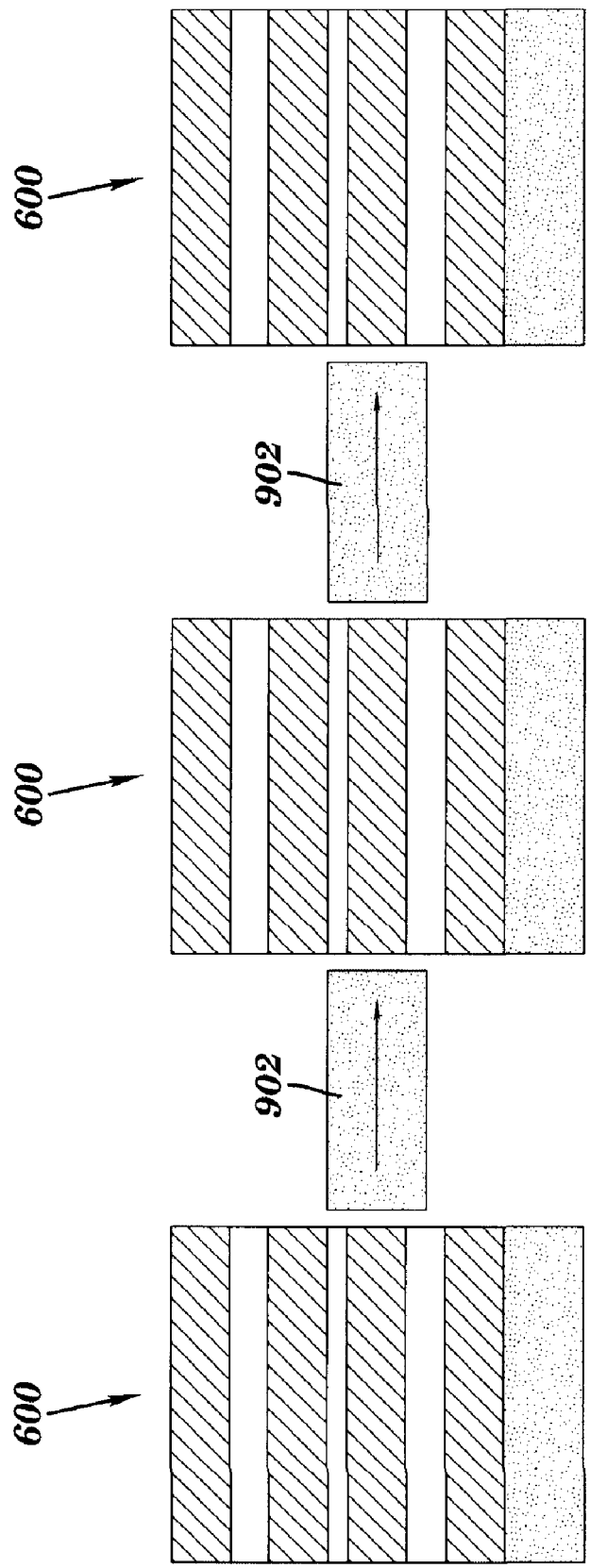
FIG. 10 is a sectional view of the storage elements and offset field (bias) elements, taken along the lines 10-10 of FIG. 9.

As also indicated previously, still another suitable way to generate an offset/bias field would be to form pinned or high $H_c$ materials between the individual memory elements, conceptually similar to permanent magnet stabilization elements in magnetic recording heads. As shown in FIG. 9, an array of storage elements 600 has a plurality of individual bias elements 902 disposed therebetween, having an exemplary orientation of about 45 degrees with respect to the wordline and bitline axes in order to reduce the magnitude of applied write field. It will be noted that this manner of offset field generation is particularly applicable to the embodiment of FIG. 6 (i.e., no AF pinning layer formed in the vertical cell stack itself). Finally, FIG. 10 is a sectional view of the storage elements 600 and offset field (bias) elements 902, taken along the lines 10-10 of FIG. 9. In particular, the bias elements 902 are shown in close proximity to the neighboring tunnel junction stacks of the storage elements 900, but not in electrical contact therewith.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A magnetic random access memory (MRAM) device, comprising:
   a reference magnetic region consisting of a single ferromagnetic layer having a resultant magnetic moment vector which is stabilized in a desired orientation only in the presence of an offset magnetic field;
   a storage magnetic region having an anisotropy easy axis and a resultant magnetic moment vector oriented in a position parallel or antiparallel to that of said reference magnetic region;
   a tunnel barrier disposed between said reference magnetic region and said storage magnetic region;
   said reference magnetic region, said storage magnetic region and said tunnel barrier defining a storage cell configured for a write operation thereto by a toggle mode; and
   said storage cell having said offset field applied thereto so as to stabilize said resultant magnetic moment vector of said reference magnetic region in said desired orientation, with said offset field allowing rotation, but not switching, of said resultant magnetic region by between about 30 degrees and about 45 degrees away with respect to a rest orientation during a write operation, wherein a magnitude of said offset magnetic field is smaller in magnitude than a write field applied during the write operation.

2. The MRAM device of claim 1, wherein said offset field further alters the magnitude of switching field used to perform said toggle mode write operation of said storage magnetic region.

3. The MRAM device of claim 1, further comprising a bias element configured to generate said offset field, said bias element disposed outside a vertical stack of said storage cell.

4. The MRAM device of claim 3, wherein said bias element is configured within an array of MRAM storage elements, said array of MRAM storage elements including said storage cell.

5. The MRAM device of claim 4, wherein said bias element is configured between said storage cell and an adjacent storage cell within said array.

6. The MRAM device of claim 5, wherein said bias element is oriented at about 45 degrees with respect to a wordline and a bitline axis of said array.

7. The MRAM device of claim 6, wherein said bias element is disposed proximate corresponding tunnel barriers of said storage cell and said adjacent storage cell.

8. The MRAM device of claim 1, wherein said reference magnetic region has a coercivity of less than about 100 Oersteds (Oe).

9. A magnetic random access memory (MRAM) device, comprising:
   a reference magnetic region consisting of a single ferromagnetic layer having a resultant magnetic moment vector stabilized in a desired orientation by a bias element physically separated from said reference magnetic region by a spacer layer;
   a storage magnetic region having an anisotropy easy axis and a resultant magnetic moment vector oriented in a position parallel or antiparallel to that of said reference magnetic region;
   a tunnel barrier disposed between said reference magnetic region and said storage magnetic region;
   said reference magnetic region, said storage magnetic region and said tunnel barrier defining a storage cell configured for a write operation thereto by a toggle mode;
   said bias element and said spacer layer further configured within a vertical stack of said storage cell; and
   said bias element configured to generate an offset magnetic field applied to said storage cell so as to stabilize said resultant magnetic moment vector of said reference magnetic region in said desired orientation, with said offset field allowing rotation, but not switching, of said resultant magnetic region by between about 30 degrees and about 45 degrees away with respect to a rest orientation during a write operation, wherein a magnitude of said offset magnetic field is smaller in magnitude than a write field applied during the write operation.

10. The MRAM device of claim 9, wherein said offset field further alters the magnitude of switching field used to perform said toggle mode write operation of said storage magnetic region.

11. The MRAM device of claim 9, wherein said spacer layer is configured as a diffusion barrier between said bias element and said tunnel barrier.

12. The MRAM device of claim 9, wherein said spacer layer has a thickness of at least about 50 angstroms.

13. The MRAM device of claim 9, wherein said bias element comprises a pinned ferromagnetic material and a pinning antiferromagnetic material.

14. The MRAM device of claim 9, wherein said reference magnetic region has a coercivity of less than about 100 Oersteds (Oe).

* * * * *